United States Patent
Freer (10) Patent No.: US 10,361,516 B2
(45) Date of Patent: Jul. 23, 2019

(54) ELECTRICAL CONNECTOR PLUG CONTINUITY

(71) Applicant: Eaton Intelligent Power Limited, Dublin (IE)

(72) Inventor: Benjamin Avery Freer, Syracuse, NY (US)

(73) Assignee: Eaton Intelligent Power Limited (IE)

( * ) Notice: Subject to any disclaimer, the term of this patent is extended or adjusted under 35 U.S.C. 154(b) by 0 days.

(21) Appl. No.: 15/398,191

(22) Filed: Jan. 4, 2017

(65) Prior Publication Data

US 2017/0194746 A1  Jul. 6, 2017

Related U.S. Application Data (60) Provisional application No. 62/275,033, filed on Jan. 5, 2016.

(51) Int. Cl.
| | | |
|---|---|---|
| *H01R 13/652* | (2006.01) | |
| *H01R 13/641* | (2006.01) | |
| *G01R 31/02* | (2006.01) | |
| *H01R 13/66* | (2006.01) | |
| *H01R 13/717* | (2006.01) | |

(52) U.S. Cl.
CPC ......... *H01R 13/652* (2013.01); *G01R 31/026* (2013.01); *H01R 13/641* (2013.01); *H01R 13/6683* (2013.01); *H01R 13/7175* (2013.01); *H01R 2201/20* (2013.01)

(58) Field of Classification Search
CPC .............. H01R 13/652; H01R 13/717; H01R 13/7175; H01R 23/025; H01R 23/6641
USPC ........................................ 439/488, 489, 490
See application file for complete search history.

(56) References Cited

U.S. PATENT DOCUMENTS

| | | |
|---|---|---|
| 3,736,505 A | 5/1973 | Sankey |
| 3,753,203 A | 8/1973 | Link |
| 3,836,844 A | 9/1974 | Prugh |
| 3,876,911 A | 4/1975 | Schweitzer, Jr. |
| 3,953,099 A * | 4/1976 | Wilson ................... H01R 13/50 439/205 |
| 4,318,578 A | 3/1982 | Ericson et al. |
| 5,179,253 A * | 1/1993 | Munniksma ............. H01R 4/22 174/87 |

(Continued)

FOREIGN PATENT DOCUMENTS

JP     2010-110055 A     5/2010

OTHER PUBLICATIONS

International Search Report and Written Opinion for Application No. PCT/US2017/012131 dated Mar. 21, 2017.

*Primary Examiner* — Tulsidas C Patel
*Assistant Examiner* — Peter G Leigh
(74) *Attorney, Agent, or Firm* — Merchant & Gould P.C.

(57) ABSTRACT

An electrical connector includes a housing with a plurality of electrical contacts, including a ground contact, extending therefrom. The connector has a shell with the housing positioned therein. A monitor circuit is positioned in the housing and configured to determine continuity between the shell and the ground contact. In some examples, the monitor circuit includes an output connected to an indicator that is configured to output a signal in response to the continuity determination to indicate the condition of the connection between the ground contact and the connector shell.

17 Claims, 6 Drawing Sheets

(56) References Cited

U.S. PATENT DOCUMENTS

| | | | | |
|---|---|---|---|---|
| 5,228,871 A * | 7/1993 | Goodman | H01R 13/65802 | 439/108 |
| 5,256,962 A * | 10/1993 | Munniksma | H01R 4/22 | 174/87 |
| 6,217,371 B1 * | 4/2001 | Wu | H01R 13/6641 | 439/490 |
| 6,227,911 B1 * | 5/2001 | Boutros | H01R 13/719 | 439/490 |
| 6,259,170 B1 * | 7/2001 | Limoge | B60Q 1/305 | 307/10.1 |
| 6,328,603 B1 * | 12/2001 | Chang | H01R 13/6641 | 439/620.19 |
| 7,232,323 B2 * | 6/2007 | Mohs | H01R 13/18 | 439/265 |
| 7,413,467 B1 * | 8/2008 | Lai | H01R 13/641 | 439/489 |
| 7,445,452 B1 * | 11/2008 | Wu | H01R 13/6205 | 439/39 |
| 7,753,689 B1 * | 7/2010 | Wu | H01R 13/648 | 439/490 |
| 7,825,537 B2 | 11/2010 | Freer | | |
| 7,994,795 B2 * | 8/2011 | Drake | G01R 19/16566 | 307/9.1 |
| 8,142,220 B2 * | 3/2012 | Burns | H01R 13/465 | 439/488 |
| 8,251,740 B2 * | 8/2012 | Grice | H01R 13/641 | 439/490 |
| 8,257,100 B2 * | 9/2012 | Lu | H01R 12/7094 | 439/188 |
| 8,753,133 B1 | 6/2014 | Errata, Jr. et al. | | |
| 2007/0249202 A1 * | 10/2007 | Ting | H01R 13/641 | 439/159 |
| 2008/0003867 A1 * | 1/2008 | Wu | H01R 13/6658 | 439/490 |
| 2009/0160427 A1 * | 6/2009 | Drake | G01R 19/16566 | 324/72 |
| 2010/0240230 A1 * | 9/2010 | Lee | H01R 9/03 | 439/38 |
| 2011/0241891 A1 * | 10/2011 | Tong | G01R 31/025 | 340/650 |
| 2012/0062385 A1 | 3/2012 | Wiesemann et al. | | |
| 2013/0183042 A1 * | 7/2013 | Knapp | G08C 23/04 | 398/106 |
| 2013/0183043 A1 * | 7/2013 | Elberbaum | G01R 19/00 | 398/115 |
| 2014/0127926 A1 | 5/2014 | Condo et al. | | |
| 2015/0303710 A1 * | 10/2015 | John | A61N 1/3785 | 307/104 |
| 2015/0340791 A1 | 11/2015 | Kao et al. | | |
| 2015/0357751 A1 * | 12/2015 | Gao | H01R 13/5808 | 439/460 |

* cited by examiner

ELECTRICAL CONNECTOR PLUG CONTINUITY

CROSS-REFERENCE TO RELATED APPLICATION

This application claims the benefit of U.S. Provisional Patent Application No. 62/275,033, filed on Jan. 5, 2016, the contents of which are incorporated by reference.

BACKGROUND

Electrical connectors, such as shielded multi-pin high voltage connectors, are adapted to provide high power electrical connections for electrically operated devices such as motor-generator sets, compressors, heating and cooling units, welders, conveyors, lighting systems, trailers, etc. in situations where permanent electrical connections are inconvenient or unavailable. Such connectors typically include various safety features. For example, some pin and sleeve high voltage plugs and receptacles can handle up to 600V and 100 A. Thus, for safety reasons, it is important that the orientation of the pins is correct when mating corresponding connector components, and that the shells of the components are properly grounded. Some known connectors use keyed shells to maintain the correct orientation of the plug and receptacle, and a longer ground pin so that the ground pins make a connection before the high voltage pins. The shell of the plug and/or receptacle is internally wired to ground, which is connected to the connector component ground when the plug is received in the receptacle.

SUMMARY

Providing proper grounding for electrically powered equipment is important for safety reasons. For example, the conductive outer shells of an electrical receptacle may be connected to ground to prevent user contact with dangerous voltage if a current-carrying conductor in the connector were to inadvertently contact the shell. Further, such connections to ground may limit the build-up of static electricity when handling flammable products or electrostatic-sensitive devices, and could mitigate the effects of a lightning strike. As an added safety measure, the shell of a plug received by the receptacle may be internally wired to ground, so that the plug shell is grounded when it is received by the receptacle. However, if the internal ground wiring were to loosen or become disconnected, it could go unnoticed until maintenance is performed or an incident occurs.

In accordance with aspects of the present disclosure, the continuity between the shell of an electrical connector and its ground contact is monitored. The electrical connector includes a housing with a plurality of electrical contacts, including the ground contact, extending therefrom. The connector has a shell with the housing positioned therein. A monitor circuit is positioned in the housing and configured to determine continuity between the shell and the ground contact. In some examples, the monitor circuit includes an output connected to an indicator, such as an LED, that is configured to output a signal in response to the continuity determination to indicate the condition of the connection between the ground contact and the connector shell. The connector could be a high voltage plug or receptacle, for example, with the monitor circuit provided in either or both of the shell and receptacle.

DETAILED DESCRIPTION

In the following Detailed Description, reference is made to the accompanying drawings, which form a part hereof, and in which is shown by way of illustration specific examples in which the invention may be practiced. It is to be understood that other examples may be utilized and structural or logical changes may be made without departing from the scope of the present invention. The following detailed description, therefore, is not to be taken in a limiting sense.

Figure 1:
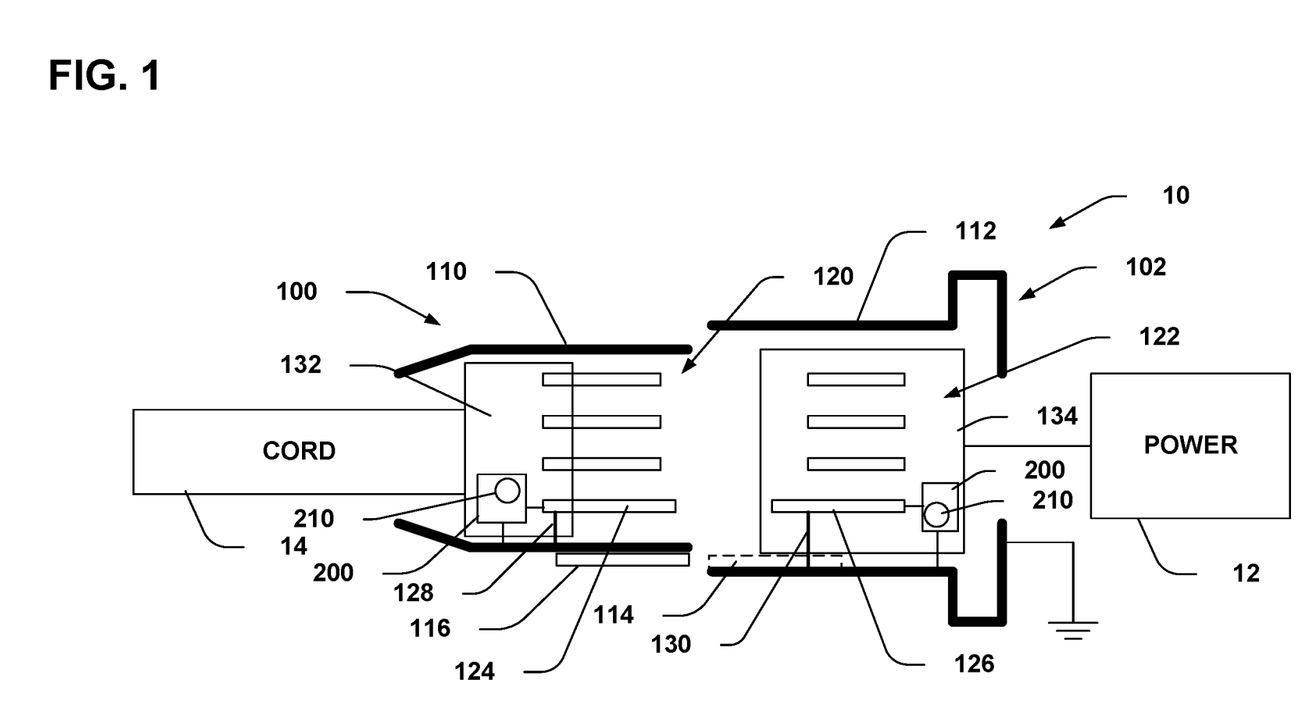
FIG. 1 is a block diagram illustrating an example connector system in accordance with aspects of the present disclosure.
Figure 2:
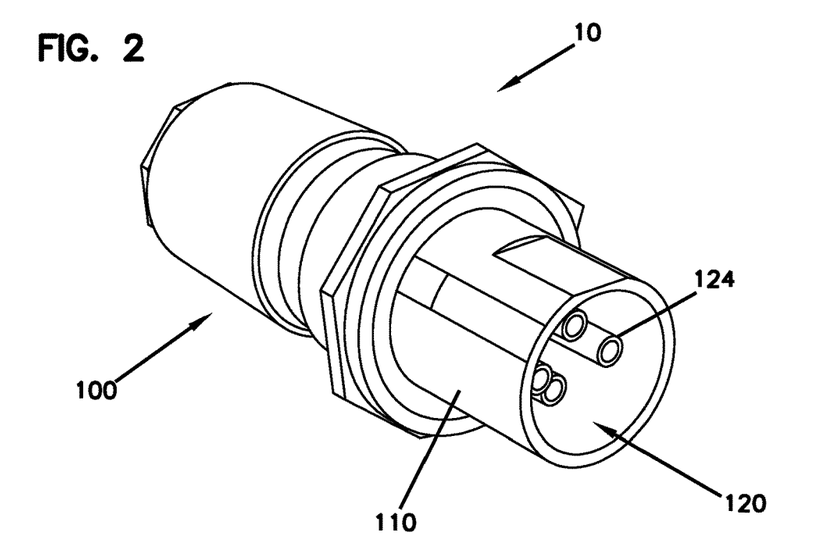
FIG. 2 is a perspective view of an example plug of the connector system shown in FIG. 1.
Figure 3:
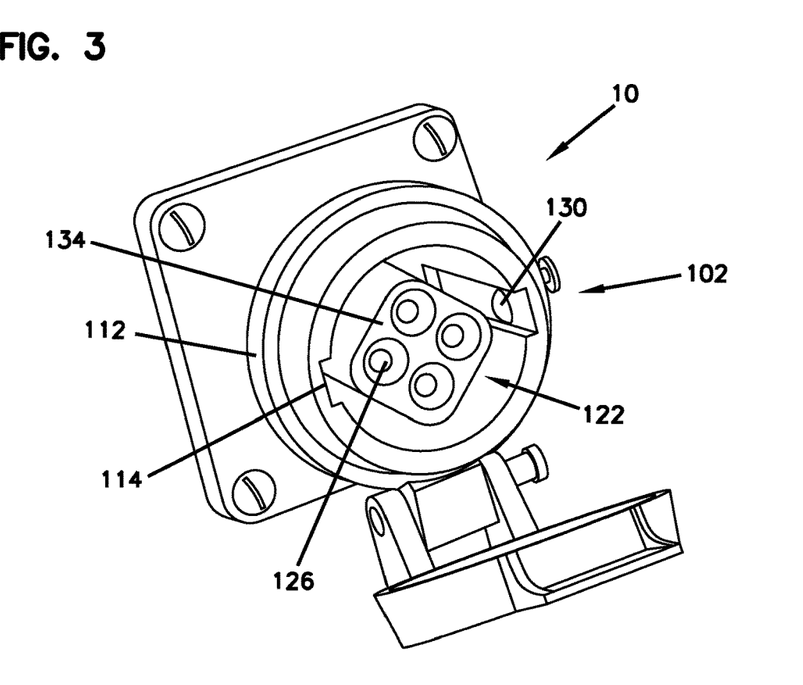
FIG. 3 is a perspective view of an example receptacle of the connector system shown in FIG. 1.

FIG. 1 schematically illustrates an example of an electrical connector system 10 in accordance with aspects of the present disclosure. The connector system 10 includes first and second connectors, which in the illustrated example are a plug 100 and receptacle 102 of a pin and sleeve voltage connector. FIGS. 2 and 3 show examples of the plug 100 and receptacle 102, respectively. The receptacle 102 is connected to a power source 12, and the plug 100 is connected to an electrical cord 14 of a device to be powered. When the plug 100 is mated with the receptacle 102, power is provided to the device via the connector system 10.

The plug 100 and receptacle 102 each include a respective conductive shell 110, 112 that encloses electrical contacts 120, 122. Housings 132, 134 in the plug 100 and receptacle, respectively, hold the electrical contacts 120, 122. The electrical contacts 120, 122 of the plug 100 and receptacle 102 include respective ground contacts 124, 126. Some pin and sleeve voltage receptacles and plugs, such as the plug 100 and receptacle 102 shown in FIGS. 1-3, handle up to 600V and 100 A. In view of the relatively high voltage, it is important to properly ground the plug 100 and receptacle 102. The ground contact 126 of the receptacle 102 is connected to the ground contact of the power source 12, and the ground contact 124 of the plug is connected to the ground wire of the cord 14, which connects to the equipment ground. Some embodiments employ longer ground contacts 124, 126 so that the ground contacts make a connection before the remaining contacts 120, 122 as the receptacle 100 and plug 102 are mated.

Further, the shells 110, 112 of the respective plug 100 and receptacle 102 are internally wired to their respective ground contacts 124, 126 via respective jumpers 128, 130. The shell 112 of the receptacle 102 is connected to ground, and the shell 110 of the plug 100 is connected to ground by its contact with the shell 112 when it is received by the receptacle 102. To help insure proper grounding of the shells 110, 112, a slot 114 may be formed in the receptacle shell 112 with a corresponding key 116 provided on the plug shell 110 to maintain the correct orientation as the plug 110 and receptacle 112 are mated. The ground jumpers 128, 130 may be connected to the respective key 116 and slot 114 to further insure a good ground connection between the shells 110, 112 of the plug 100 and receptacle 102.

If the internal connection between the ground contacts 124, 126 and their respective shells 110, 112 is faulty, it could go unnoticed until either maintenance is performed or an incident occurs. Thus, in the illustrated example connector system 10, a monitor circuit 200 that is configured to determine continuity between the shell 110, 112 and the respective ground contact 124, 126 is provided in one or both of the plug 100 and receptacle 102. The monitor circuit 200 is positioned, for example, in the housing 132 of the plug 100, though it could also be provided in the housing 134 of the receptacle 102 in addition to, or in place of, the monitor circuit 200 in the plug 100.

Figure 4:
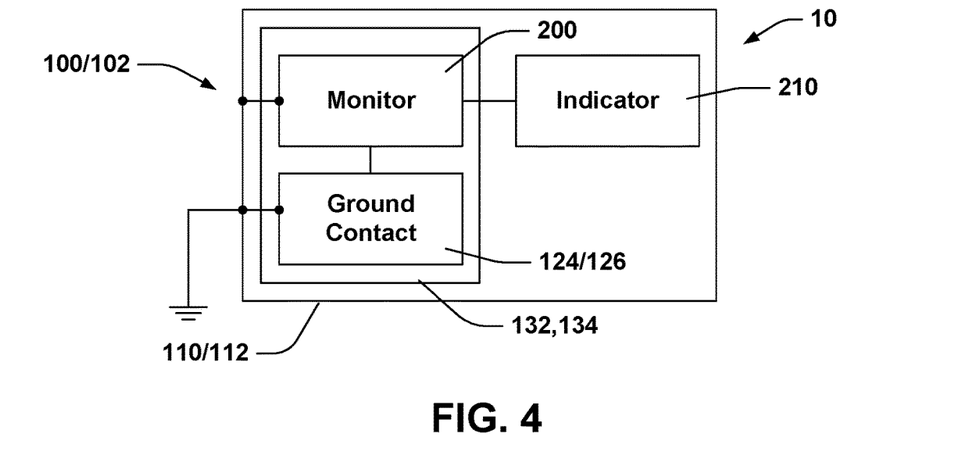
FIG. 4 is a block diagram illustrating aspects of an example connector system in accordance with aspects of the present disclosure.

FIG. 4 is a block diagram illustrating aspects of the connector system 10. As noted above, it is important to insure a good connection between the ground contacts 124, 126 and their respective conductive shells 110, 112. In accordance with certain aspects of the present disclosure, a monitor circuit 200 is provided that is configured to determine continuity between the shell 110, 112 and the respective ground contact 124, 126. In some embodiments, the monitor circuit 200 is provided for the plug 100, though the monitor circuit 200 could be employed on either or both of the plug 100 and/or receptacle 102.

The continuity monitor circuit 200 may be positioned in one or both of the housings 132,134 from which the relevant ground contact 124, 126 extends. The ground contacts 124, 126 are connected to the respective shells 110, 112 which are grounded. In the case of the plug 100, the ground contact 124 is connected to the ground wire of the cable 14 terminated by the plug 100, which connects to the ground terminal of the device powered via the plug 100. The shell 110 itself of the plug 100 is grounded when it couples with the shell 110 of the receptacle 102, which is connected to ground.

The continuity monitor circuit 200 is configured to determine continuity between the shell 110 and ground contact 124, and/or the shell 112 and ground contact 126. The circuit 200 provides an output that is received by an indicator 210, which provides a signal indicating the determined continuity between the shell 110,112 and ground contact 124, 126.

Figure 5:
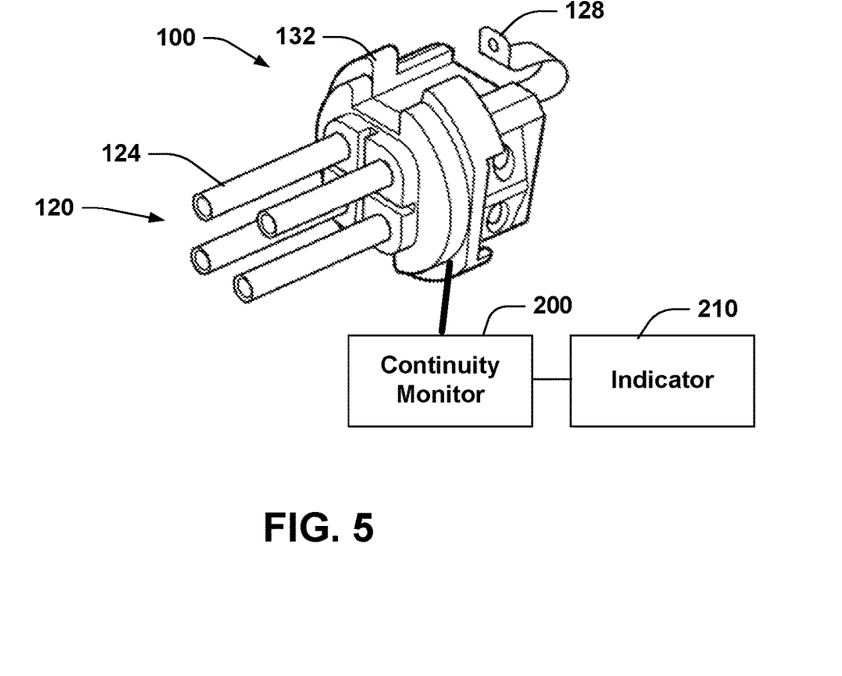
FIG. 5 is a perspective view illustrating an example of some components of the plug shown in FIG. 2.

FIG. 5 illustrates an example of the plug 100 with the shell 110 removed, showing some the inner components of the plug 100. The plug 100 includes the housing 132 from which the plurality of electrical contacts 120 extend. In the illustrated example, the contacts 120 are conductive sleeves that receive corresponding conductive pins of the receptacle 102 when the plug 100 is mated with the receptacle 102. The housing 132 and sleeves 120 are positioned in the shell 110 as shown in FIGS. 1 and 2. In some examples, the indicator 210 is provided to output an indicator signal in response to the continuity monitor circuit 200. For example, the indicator could an LED that outputs a red warning light if the monitor circuit 200 determines a bad ground connection.

Figure 6:
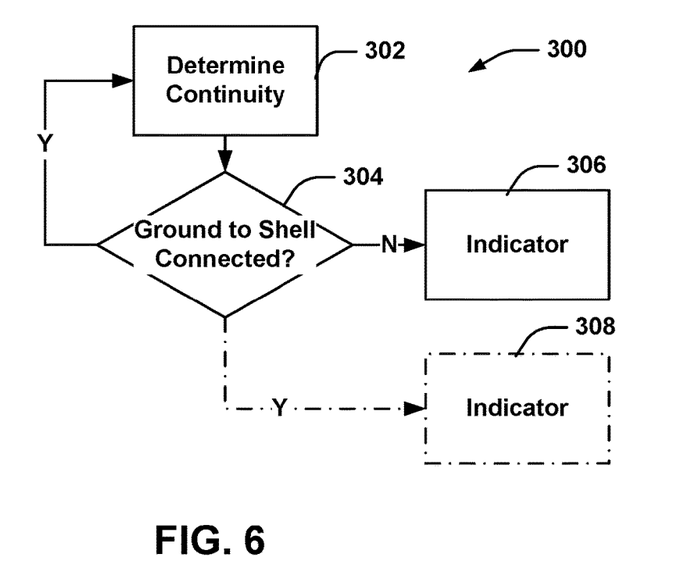
FIG. 6 is a flow diagram illustrating an example of a method for determining continuity between a ground contact and a connector shell in accordance with aspects of the present disclosure.

FIG. 6 is a flow diagram illustrating aspects of an operation method 300 for the system illustrated in FIGS. 1-5 and discussed above. In block 302, the continuity monitor circuit 200 determines continuity between the relevant ground contact 124 or 126 and shell 110 or 112. If the connection between the ground contact 124 or 126 and the shell 110 or 112 is determined to be satisfactory in block 304, the monitor circuit 200 continues to monitor continuity. If in block 304 it is determined that the ground connection between the ground contact 124 or 126 and the shell 100 or 112 is faulty, an indication signal is output at block 306, which is received by the indicator 210 to provide an alert regarding the potentially faulty ground connection.

Figure 7:
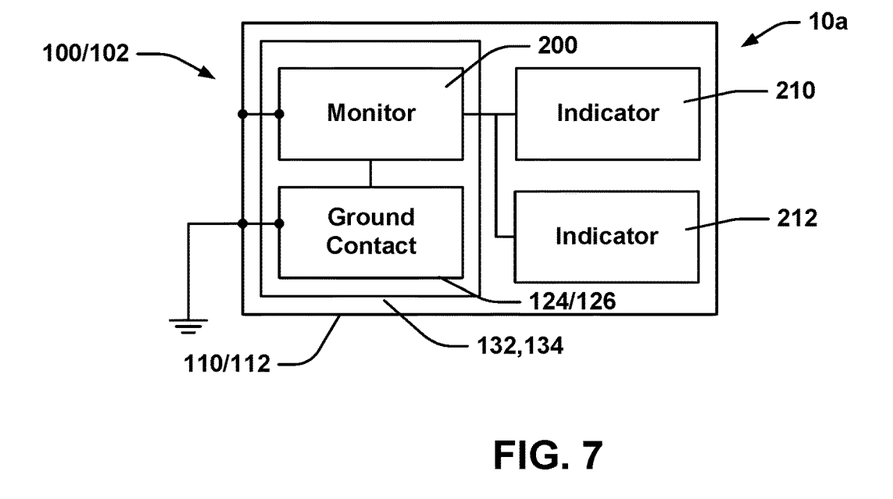
FIG. 7 is a block diagram illustrating aspects of another example connector system in accordance with aspects of the present disclosure.

In some embodiments, additional indicators may be provided. In the example connector system 10a shown in FIG. 7, a second indicator 212 receives an output of the monitor circuit 200. Referring back to FIG. 6, in block 302 the continuity monitor circuit 200 determines continuity between the ground contact 124 and the shell 110 of the plug 100, or between the ground contact 126 and shell 112 of the receptacle 102 depending on the system configuration. In block 304, if the connection between the ground contact 124 or 126 and the shell 110 or 112 is determined to be satisfactory, the monitor circuit 200 continues to monitor continuity. Additionally, a second indicator signal is output at block 308 if the connection between the ground contact 124 or 126 and the shell 100 or 112 is satisfactory to indicate the satisfactory condition.

For example, the first indicator 210 could be a red LED that lights to indicate a problem with the ground continuity in block 306. If the connection between the ground contact 124 and the shell 110 is satisfactory as determined in block 304 of FIG. 6, the second indicator 212 provides a signal in block 308 indicating the satisfactory ground connection. For example, the second indicator could be a green LED that lights to indicate the system is properly grounded.

Figure 8:
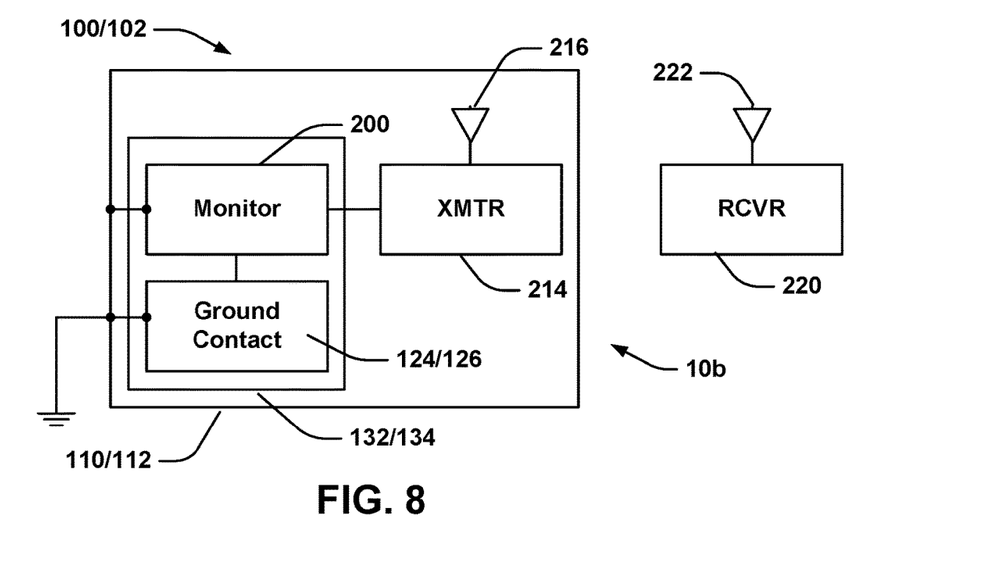
FIG. 8 is a block diagram illustrating aspects of another example connector system in accordance with aspects of the present disclosure.

FIG. 8 illustrates another example connector system 10b in which an alternative indicator 214 is provided. As with FIGS. 4 and 7 discussed above, the monitor 200 and indicator 214 may be employed on either or both of the plug 100 and receptacle 102. The continuity monitor circuit 200 is positioned in the housing 132 or 134 from which the ground contact 124 or 126 extends. The continuity monitor circuit 200 is connected to determine continuity between the shell 110 or 112 and the ground contact 124 or 126. The circuit 200 provides an output that is received by an indicator 214, which in the example of FIG. 8 is a wireless transmitter including an antenna 216. The indicator 214 is configured to send a signal to a receiver 220, which includes a respective antenna 222.

Figure 9:
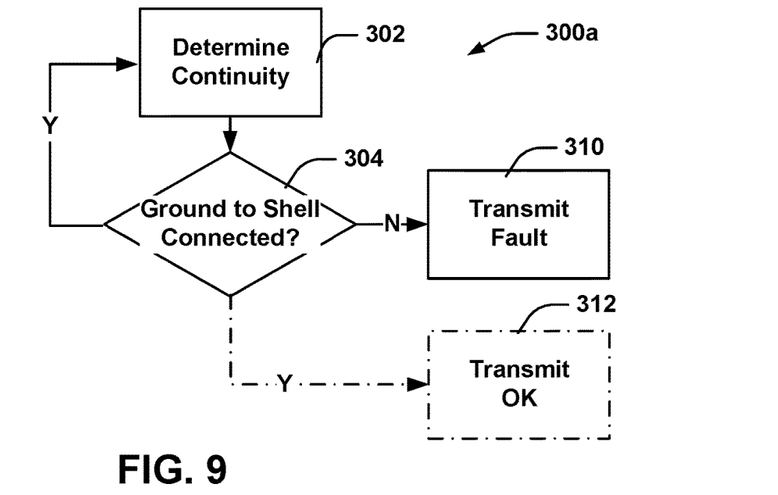
FIG. 9 is a flow diagram illustrating another example of a method for determining continuity between a ground contact and a connector shell in accordance with aspects of the present disclosure.

FIG. 9 illustrates an example of an operation method 300a for the system 10b shown in FIG. 8. As with the example shown in FIG. 6, the continuity monitor circuit 200 determines continuity between the ground contact 124 or 126 and the shell 110 or 112 in block 302. If the connection between the ground contact 124 or 126 and the shell 110 or 112 is determined to be satisfactory in block 304, the monitor circuit 200 continues to monitor continuity. If in block 304 it is determined that the connection between the ground contact 124 or 126 and the shell 100 or 112 is faulty, a fault signal is output at block 310, which is sent by the transmitter 214 to the receiver 220 for display at a remote location such as an operator panel.

In some embodiments, additional indicators may be sent by the transmitter 214. For example, as shown in FIG. 9, if the connection between the ground contact 124 or 126 and the shell 110 or 112 is satisfactory as determined in block 304, the system continues to monitor continuity in block 302. Additionally, if the ground connection is satisfactory, the transmitter 214 could be configured to send a second signal to the receiver indicating the satisfactory ground connection.

Figure 10:
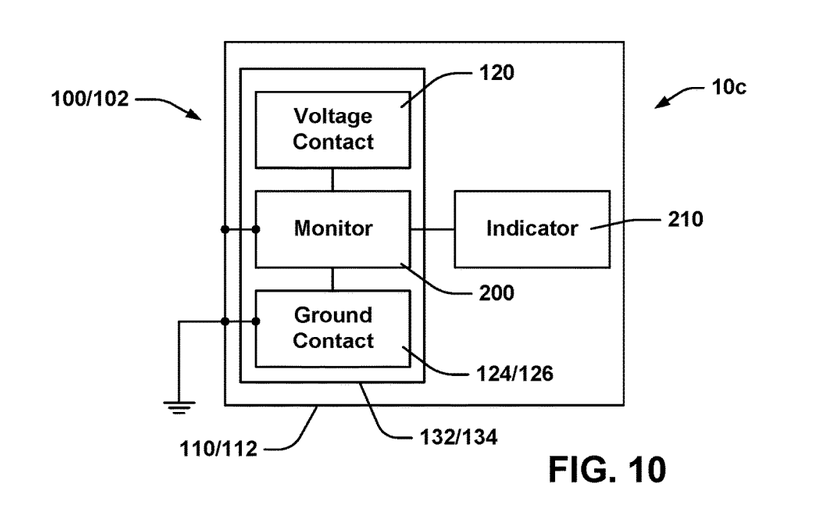
FIG. 10 is a block diagram illustrating aspects of another example connector system in accordance with aspects of the present disclosure.

FIG. 10 illustrates an example system 10c in which power from one or more of the voltage contacts is harvested to power the continuity monitor circuit 200 and indicator 210 (and/or the indicator 212 and transmitter 214). As with the system block diagrams discussed above, the monitor circuit 200 and indicator 210 could be employed on either or both of the plug 100 and receptacle 102. The continuity monitor circuit 200 is positioned in the housing 132 or 134 from which the ground contact 124 or 126 extends. The continuity monitor circuit 200 is coupled to at least one of the voltage contacts 120, 122 that extends from the housing 132 or 134 to receive power therefrom for operation of the continuity monitor circuit 200 and the indicator 210. For example, a current sensing transformer may be coupled to a voltage contact 120 to harvest power for the measurement circuit 200.

In some embodiments, the continuity monitor circuit 200 determines the continuity between the ground contact 124 or 126 and the respective shell 110 or 112 by measuring voltage between the ground contact 124 or 126 and the shell 110 or 112. No voltage would be present if the ground contact 124 or 126 is properly connected (shorted) to the respective shell 110 or 112. If a voltage exists, it indicates an improper ground connection.

Figure 11:
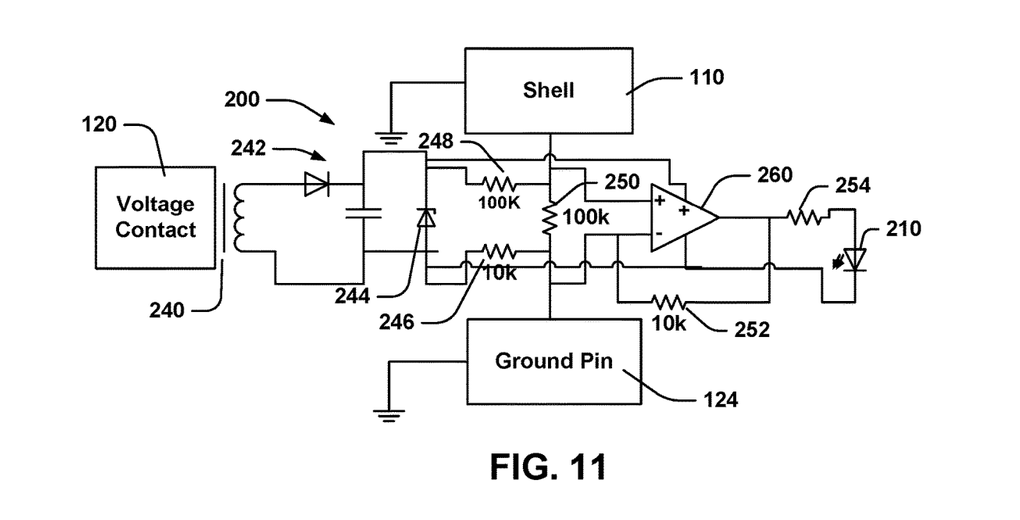
FIG. 11 is a circuit diagram illustrating an example continuity monitoring system and indicator in accordance with aspects of the present disclosure.

FIG. 11 illustrates an example of the continuity monitor circuit 200 and indicator 210. FIG. 11 is described in terms of the plug 100, though the disclosed monitor circuit 200 may be employed on either or both of the plug 100 and receptacle 102. The monitor circuit 200 is positioned in the housing 132 from which the ground contact 124 extends, and the ground contact 124 is connected to the shell 110, which is connected to ground through its connection with the shell 112 of the receptacle 102, which is connected to ground.

In the illustrated example monitor circuit 200, power is harvested from one of the voltage contacts 120 to power the circuit 200 and indicator 210, which is an LED in the illustrated example. A current-sense transformer 240 is coupled to the voltage contact 210. The output of the current-sense transformer 240 is connected to an Op Amp 260 via a filter 242, a breakdown diode 244 and resistors 246, 248, 250. The output of the Op Amp 260 is received by the anode of the LED 210 through a resistor 254. The cathode of the LED 210 is connected to the anode of the breakdown diode 244. The output of the Op Amp 260 is further fed back to an input through a resistor 252.

If there is a good connection between connector shell 110 and the ground contact 124, the 100k resistor 250 will be effectively shorted, and the voltage on the Op Amp inputs will be approximately 450 mV. This voltage will also be present on the output of the Op Amp 260, and the LED 210 will not be illuminated.

If there is a poor connection between the connector shell 110 and the ground contact 124, the voltage between the inputs of the Op Amp 260 will increase up to a maximum of about 2.4V. To compensate, the Op Amp 260 will drive its output to 5V, illuminating the LED 210.

In other embodiments, for example, power could be supplied by a coin cell battery rather than the power harvesting arrangement shown in FIG. 11. The transmitter 214 could be connected to the output of the Op Amp 260 in addition to or in place of the LED 210.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An electrical connector system, comprising:
    a plug including a shell having a housing positioned therein;
    the housing having a plurality of electrical conductive contacts including a ground contact, the conductive contacts including sleeves extending from the housing;
    a monitor circuit positioned in the housing and configured to determine continuity between the shell and the ground contact, wherein the monitor circuit is configured to output an indicator signal based on the determined continuity between the shell and the ground contact.

2. The system of claim 1, wherein the monitor circuit includes an output connected to an indicator that is configured to output the indicator signal to the indicator.

3. The system of claim 2, wherein the indicator includes a first LED.

4. The system of claim 2, wherein the indicator includes first and second LEDs.

5. The system of claim 2, wherein the indicator includes a wireless signal transmitter.

6. The system of claim 1, wherein the monitor circuit is configured to measure voltage between the shell and the ground contact.

7. The system of claim 1, wherein the monitor circuit is powered by power harvested from the electrical conductive contacts.

8. The system of claim 7, further comprising a current sensing transformer coupled to a first one of the electrical conductive contacts and having an output connected to the monitor circuit.

9. The system of claim 8, further comprising an amplifier having input and output terminals, the input terminals connected to the output of the current sensing transformer, and the output terminals connected to an indicator.

10. An electrical connector system, comprising:
    a first connector including a first housing received in a first shell with a first plurality of electrical contacts extending from the first housing, the first plurality of electrical contacts including a first ground contact connected to the first shell;
    a second connector including a second housing received in a second shell with a second plurality of electrical contacts extending from the second housing, the second plurality of electrical contacts including a second ground contact connected to the second shell, the first and second connectors configured to mate with one another such that the respective first and second electrical contacts make electrical connections with one another;
    a monitor circuit positioned in the first housing and configured to determine continuity between the first shell and the first ground contact and output an indicator signal in response to the determined continuity; and an indicator connected to receive the indicator signal output from the monitor circuit.

11. The system of claim 10, wherein:

the first connector is a plug;

the first plurality of electrical contacts include sleeves extending from the first housing;

the second connector is a receptacle;

the second plurality of electrical contacts include pins extending from the second housing; and the second ground contact and the second shell are connected to ground.

12. The system of claim 10, wherein the indicator includes a first LED configured to light in response to the monitor circuit determining a continuity fault between the first ground contact and the first shell.

13. The system of claim 10, wherein the indicator is received in the second shell.

14. The system of claim 10, wherein the monitor circuit is configured to measure voltage between the first shell and the first ground contact.

15. The system of claim 10, wherein the monitor circuit is powered by power harvested from the at least one of the first plurality of electrical contacts.

16. A method of monitoring continuity in an electrical connector, comprising:

providing a shell containing a plurality of electrical contacts including a ground contact, the ground contact connected to the shell;

measuring a voltage between the ground contact and the shell;

activating an indicator in response to the voltage measurement exceeding a predetermined level; and harvesting power from at least one of the plurality of electrical contacts to power a monitoring circuit.

17. The method of claim 16, wherein measuring the voltage includes providing a monitoring circuit in a housing received in the shell, wherein the plurality of electrical contacts extend from the shell.

\* \* \* \* \*